United States Patent [19]

Bult et al.

[11] Patent Number: 4,690,725

[45] Date of Patent: Sep. 1, 1987

[54] PURIFICATION OF CD AND TE BY ZONE REFINING

[75] Inventors: Roelof P. Bult, Fruitvale; Alan B. I. Bollong, Trail; Robert F. Redden, Fruitvale, all of Canada

[73] Assignee: Cominco Ltd., Vancouver, Canada

[21] Appl. No.: 800,932

[22] Filed: Nov. 22, 1985

[51] Int. Cl.[4] .................. C01B 19/02; C30B 13/02; C30B 13/08

[52] U.S. Cl. .................. 156/617 R; 75/65 ZM; 156/620; 156/DIG. 66; 156/DIG. 72; 156/DIG. 92; 423/510

[58] Field of Search .............. 156/DIG. 72, DIG. 92, 156/DIG. 66, 620, 617 H, 617 R; 423/510; 75/65 ZM

[56] References Cited

U.S. PATENT DOCUMENTS

| | | | |
|---|---|---|---|
| 2,739,088 | 3/1956 | Pfann | 156/617 H |
| 3,144,357 | 8/1964 | Hulme et al. | 75/65 ZM |
| 3,849,205 | 11/1974 | Brau et al. | 156/620 |
| 4,003,741 | 1/1977 | Gallet et al. | 75/65 ZM |
| 4,011,074 | 3/1977 | Dietl et al. | 156/617 H |
| 4,507,160 | 3/1985 | Beck et al. | 156/DIG. 66 |

FOREIGN PATENT DOCUMENTS 770574 10/1967 Canada .................. 75/65 ZM

Primary Examiner—William R. Dixon, Jr.
Assistant Examiner—Robert M. Kunemund
Attorney, Agent, or Firm—Arne I. Fors; Robert F. Delbridge

[57] ABSTRACT

Cd and Te are purified by multiple-pass zone refining in the presence of a small amount of an added gettering substance chosen from Cd, Te and CdTe. In the purification of Cd, Te, or CdTe is added, the amount of Te or of Te in CdTe being less than the amount of Te in the Cd-rich eutectic composition between Cd and Te. In the purification of Te, Cd or CdTe is added, the amount of Cd or of Cd in CdTe being less than the amount of Cd in the Te-rich eutectic composition between Cd and Te. The Cd and Te so purified have an improved purity as witnessed by SSMS analyses, the increased ductility of the Cd and a much higher yield of the number of slices of CdHgTe produced with the refined Cd and Te meeting the specifications for carrier concentration and mobility.

5 Claims, No Drawings

PURIFICATION OF CD AND TE BY ZONE REFINING

The U.S. Government has rights in this invention pursuant to Contract No. F33615-82-C-5128 awarded by the Department of the Air Force.

BACKGROUND OF THE INVENTION (a) Field of the Invention

This invention relates to the zone refining of cadmium and tellurium and, more particularly, to a method for the purification of cadmium and tellurium by zone refining in the presence of a gettering substance.

In the production of CdTe and CdHgTe compound semiconductors, it is necessary to use the elements with as high a purity as possible. Any iso-electronic impurities can generally be tolerated at relatively high levels, in the order of parts per million, but the carrier-generating impurities must be reduced to a level that preferably yields less than $10^{15}$ carriers/cm$^3$ in the final semiconductor. For example, for efficient infrared detection, the carrier concentration in CdHgTe must be low, the mobility high and the excited-state lifetime must be long. The presence of impurities in the elements of CdHgTe has a negative effect on these characteristics.

(b) Description of the Prior Art

The purification of Cd, Te and Hg is described by Hirsch, H. E., et al. (Preparation of High Purity Cadmium, Mercury and Tellurium, Chapter 2 of Semiconductors and Semimetals, Vol. 18, Edited by Willardson, R. K. and Beer, A. C., Academic Press, 1981).

One of the methods for producing high purity, i.e. 69 or better, cadmium and tellurium is zone refining. Cadmium is one of the most difficult low melting metals to zone refine because of its low melting point, high thermal conductivity and high volume expansion. Because many impurities have segregation coefficients close to 1.0, only partial segregation is achieved. This is particularly so for Zn, Cu, K and Mg. Tellurium is better suited for zone refining because most impurities have very low distribution coefficients and can be easily removed. Those with distribution coefficients close to unity, namely Hg, Se, Cr, Na and Cd are not so efficiently removed. Cadmium and tellurium, therefore, are usually subjected to one or more than one zone refining operation to give single-, double-, triple-, or quadruple-zone-refined grades (SZR, DZR, TZR and QZR hereinafter). Cadmium and tellurium feed material is zone refined until the impurity equilibrium is established. The refined material is cropped, i.e. the section that meets 69 purity is separated from the leading and trailing ends and subjected to the same zone refining operation to give a DZR product with a reduced impurity content. Repeating the operation yields TZR material and refining this material gives QZR grade. The highly zone refined cadmium and tellurium, and high-purity mercury, when used in the production of CdHgTe, will consistently yield $Cd_xHg_{1-x}Te$ (x=0.2) with carrier concentrations in the $10^{14}$ to $10^{15}$ range. Although such concentrations are adequate for the manufacture of most devices, further lowering of the carrier concentrations is desirable, which, however, requires the production of materials with still higher purities.

The purification of elements such as Sn, Si, Ge and Zn can be carried out by zone refining with an added solute or alloying agent for impurities or an added gettering substance. Pfann (Zone Melting, John Wiley & Sons, Inc., 1959) teaches that a substance containing an impurity can be purified by dissolving it in a solvent which enables a better separation of the impurity. The only example given by Pfann is the Sn-Si system, wherein a small quantity of Si back diffuses through an ingot of Sn and pure Sn is recovered.

According to U.S. Pat. No. 2,739,088, zone melting utilizes a two-solute system, wherein the molten zone is built up to the desired solute concentration. p-n and p-n-p junctions are formed by adding significant solute to the molten zone in solid, liquid or vapor form and in pure, alloyed or compound form. This method relates to doping and establishing solute concentration gradients.

According to U.S. Pat. No. 2 835 612, high melting point materials such as Si and Ge can be purified by zone refining with an alloying agent to alloy impurities, so that the substance is dissolved into the leading edge of the liquid region and is deposited from the trailing edge with different concentrations of impurities.

According to U.S. Pat. No. 3 047 380, Ge is purified by zone melting by adding an element which has an affinity for $O_2$ greater than for Ge, forms an oxide and has a relatively small segregation constant, sweeping the element through the Ge and removing the oxide.

It is taught in AU Patent No. 273 393 that segregable impurities may be removed by zone refining from elements by applying a getter of low coefficient of solid-state diffusion at that end of the body to which segregable impurities are directed. Specifically, In is used as a getter for Cu in Ge purification. In is introduced at the tail end and the ultimate In distribution is attained quickly (negligible Cu back diffusion is assumed).

According to U.S. Pat. No. 4,165,249, a layer of relatively pure gettering material (Si) is applied to Ge and the Ge is zone refined with multiple passes.

A Russian paper (Chemical Abstracts, volume 84; 109005r, 1976) teaches the zone melting of Zn with an added active component such as Ge, Si, In, Sb, Bi, or Ca; a combination of Ge, Sn and Si giving the highest efficiency. Elements having partition coefficients <0.5 are most suitable owing to strong interaction with impurities.

Thus, the prior art shows that zone refining of Cd and Te and that zone refining in the presence of a gettering substance for metals other than Cd and Te are well known.

SUMMARY OF INVENTION

We have now found that cadmium and tellurium can also be purified by zone refining in the presence of a gettering substance. More specifically, cadmium and tellurium are zone refined in the presence of a very small amount of tellurium and cadmium, respectively, or with a small amount of CdTe as gettering substance. The amount of Cd, Te or CdTe is less than the amount of the eutectic of Cd and Te in the Cd or Te to be zone refined. The Cd, Te or CdTe is added at the leading end of the Cd or Te ingot and the ingots are zone refined with multiple passes in one or more stages to yield SZR, DZR, TZR, or QZR Cd and Te. The addition of Cd, Te or CdTe causes an increase in the concentration of Cd in zone refined Te and Te in zone refined Cd. Such increase, however, does not affect the electrical characteristics of semiconductor compounds such as CdTe and CdHgTe made from the purified Cd and Te. The Cd and Te so zone refined have an impurity content that is lower than that of Cd and Te zone refined without addition of Cd, Te or CdTe as gettering substance, and, moreover, the yield of the number of slices of CdHgTe made from the so refined Cd and Te that meet the specifications for carrier concentration and mobility is considerably improved.

Accordingly, there is provided a method for the purification of a metal chosen from the group consisting of Cd and Te which comprises adding to an ingot of the metal an amount of a gettering substance chosen from the group consisting of Te, Cd and CdTe and subjecting the metal with added gettering substance to multiple-pass zone refining, said amount of Te or the amount of Te added in CdTe in the zone refining of Cd being less than the amount of Te in the Cd-rich eutectic composition between Cd and Te, and said amount of Cd or the amount of Cd in CdTe added in the zone refining of Te being less than the amount of Cd in the Te-rich eutectic composition between Cd and Te. Preferably, the amount of Te or of Te in CdTe is added at the leading end of an ingot of cadmium prior to zone refining in an amount less than about 10 ppmw of the ingot of Cd, and the amount of Cd or of Cd in CdTe is added at the leading end of an ingot of tellurium prior to zone refining in an amount less than about 1% by weight of the ingot of Te.

DESCRIPTION OF THE PREFERRED EMBODIMENT

In zone refining a short molten zone travels through a relatively long ingot of solid material, carrying with it soluble impurities. The action of successive molten zones travelling in the same direction is to distribute the impurities according to the ratio of their solid to liquid phase solubilities.

The final distribution of impurities depends on the rate, frequency and direction of zone travel and on an intrinsic property of each impurity known as the distribution coefficient $k_o$. The value of $k_o$ must be modified to account for width of the zone and the strength and nature of mixing within the zone.

These criteria affect the distribution of the solute within the zone. The term $k_{eff}$ describes the segregation of the impurities under actual operating conditions. If $k_{eff}$ is $>1.0$, the impurity will accumulate at the leading end of the ingot. If $k_{eff}$ is $<1.0$, the impurity has a greater solubility in the liquid phase and will be transported to the tail end of the ingot.

An impurity does not segregate independently from the other impurities, and it is therefore important to consider the interaction between impurities. Von Kujawa (Z.fur Phys. Chem., 232 (5–6), 1966, p. 425-31) explains that "if a plurality of impurities are present simultaneously, the impurity which is present in the largest amount influences the segregation behaviour of other contaminants which are present only in trace amounts because of the formation of multicomponent systems". However, in Von Kujawa's study the effect of each major impurity was to reduce the degree of segregation of the minor impurities. He found no occurrence of increased segregation.

The Cd-Te phase diagram is typical of the II-VI compounds with a maximum liquidus peak corresponding to a nearly 50/50 atomic percent compound. The eutectic value for the Te-rich side of the diagram is known to be approximately 1% Cd. The eutectic composition for the Cd-rich side is not known accurately and has been reported as being very close to pure Cd. (Zanio, K., Cadmium Telluride, Chapter 1 of Semiconductor and Semimetals, Vol. 13, Edited by Willardson and Beer, Academic Press, 1978).

The zone refining of Cd and the zone refining of Te are carried out according to well-established methods using apparatus of the conventional type. The zone refiners consist of a tube to define the refining chamber, a gas flow control panel to control the ambient, and independent power controllers for each furnace. More specifically, a Cd or Te ingot is contained in a quartz crucible having a length of 1300 mm and a semicircular cross section of 75 mm diameter. The crucible is placed in the centre of a quartz tube being 2400 mm long and having a diameter of 100 mm. Stainless steel end caps are secured to each end of the tube with O-rings. Circular furnaces are mounted on a mobile carriage and spaced equi-distantly. The motion of the carriage is controlled by an electric motor and the distance of travel is defined by two microswitches. The temperature of each furnace is controlled independently. Gas flow is controlled by a series of valves. Gases used include Ar and Pd:Ag diffused $H_2$.

In the zone refiner for Cd, an aluminum heat shield is mounted onto the carriage to provide an enclosed volume around the furnaces whereby convective air flow around the furnace is minimized allowing more stable liquid zones.

In the zone refining process, an ingot of Cd or Te is placed in the crucible and an amount of a gettering substance chosen from the group consisting of Cd, Te and CdTe is added to the ingot. The amount added is less than the amount present in the eutectic compositions at the Cd-rich side and the Te-rich side of the phase diagram. If the amount added is equal to or greater than the amount in the eutectic compositions, the enhanced segregation of impurities is not obtained. In the zone refining of Cd, the amount of added Te or the amount of Te in added CdTe is less than about 10 ppm w (10 parts per million by weight) of the Cd ingot. In the zone refining of Te, the amount of added Cd or the amount of Cd in added CdTe is less than about 1% by weight of the Te ingot. The Cd, Te, or CdTe is preferably added prior to zone refining at the leading end or head of the ingot. The addition of CdTe as gettering substance is preferred.

The Cd or Te with added gettering substance is then subjected to multiple-pass zone refining in one or more operations to yield SZR, DZR, TZR or QZR product.

The purity of the refined Cd and Te is determined by spark source mass spectroscopy or emission spectroscopy. The purity can be determined indirectly by producing CdHgTe from the Cd and Te (and Hg) and determining the electrical characteristics of slices of the CdHgTe and the yield of slices meeting the specifications for these characteristics. It was found that the purity of Cd and Te produced according to the invention was increased and that the yield of slices of CdHgTe meeting the specifications for carrier concentration and mobility was considerably improved.

The invention will now be illustrated by means of the following non-limitative examples.

EXAMPLE 1

Using the method and apparatus described above, a starting ingot of 59 commercial grade Cd was placed in the crucible. An amount of CdTe, equivalent to 10 ppmw of the ingot, was added in powdered form to the leading end of the ingot. The crucible had been coated with a layer of carbon to prevent reaction between quartz and Cd. The ingot was zone refined with a velocity of 55 mm/h. The zone width was 60 mm and 54 passes were made.

Spark source mass spectroscopic (SSMS) and emission spectroscopy (ES) analyses data of samples taken after this first set of zone passes and from different locations along the length of the ingot, did not significantly deviate from analyses data of the standard SZR product, except for a much higher Te concentration.

The bar was cropped and etched before subjected to a second set of zone passes under the same conditions, except that the total number of zone passes was 42. Samples were taken at the completion of processing.

For these samples the SSMS and ES analyses recorded the tail end segregation of Te, as expected, and high concentrations of In. The concentration of In in the starting ingot was below the detection limits. Indium is rarely detected in high purity zone-refined Cd. The high In concentrations in the tail end of the DZR ingot indicate a reduced concentration of In through the body of the ingot.

The ingot was further processed to the QZR grade. It was observed that with each additional set of zone passes, the ductility of the Cd ingot increased. Ductility is often a function of the amount of soluble impurities, and, although only In was observed to segregate from the centre portion of the bar, the concentration of other trace soluble impurities may also have been lowered. The SSMS and ES analyses results are tabulated in Table I.

TABLE I

| | Impurity | | | |
|---|---|---|---|---|
| | Te | | In | |
| Sample Position | SSMS | ES | SSMS | ES |
| | (values in ppm by weight) | | | |
| SZR-75 mm from TE* | 0.4 | 5** | ND*** | ND |
| SZR-150 mm from TE | 0.4 | ND | ND | ND |
| SZR-300 mm from TE | 0.04 | NA**** | ND | NA |
| DZR-75 mm from TE | 0.7 | 10 | 0.1 | 1.0 |
| DZR-150 mm from TE | 0.03 | ND | 0.02 | 0.1 |
| DZR-300 mm from TE | 0.02 | NA | ND | NA |
| TZR-75 mm from TE | NA | ND | NA | 0.1 |
| TZR-150 mm from TE | NA | ND | NA | ND |
| QZR-75 mm from TE | ND | ND | ND | ND |
| QZR-150 mm from TE | ND | ND | ND | ND |
| QZR-300 mm from TE | ND | NA | ND | NA |

*TE = tail end, or last to freeze portion of the ingot
**Detection limit of Te in Cd with ES is 5
***ND = not detected
****NA = no analysis The results show that in SZR, In could not be detected above the detection limit, i.e., there was no detectable segregation of In; in DZR, Te interacts with the In and In was segregated to the TE; and the Cd was spectroscopically clean of Te and In at the end of QZR processing.

EXAMPLE 2

Using the same method and apparatus as in Example 1, a starting ingot of 49 Te was placed in the crucible. An amount of powdered CdTe, equivalent to 0.5% by weight of the ingot, was added to the leading end of the ingot. The ingot was zone refined with a zone velocity of 55 mm/h. The zone width was 70 mm and 68 passes were made.

The Te ingot was refined to the QZR grade, samples being taken from the bar after SZR, DZR and QZR processing. The results are given in Table 2. The figures for Cd with CdTe added are in % by weight, all other figures are in ppm by weight.

TABLE 2

| | Cd | | Ga | | Ca | | K | |
|---|---|---|---|---|---|---|---|---|
| Sample Location | No CdTe | CdTe added | No CdTe | CdTe added | No CdTe | CdTe added | No CdTe | CdTe added |
| SZR-75 mm from TE | ND | 0.2% | ND | 1 | 0.03 | 2 | 0.02 | 0.6 |
| SZR-150 mm from TE | ND | 0.3% | ND | 0.2 | ND | 2 | 0.02 | 0.3 |
| SZR-300 mm from TE | ND | 0.2% | ND | 0.1 | ND | 0.3 | 0.01 | 0.03 |
| DZR-75 mm from TE | ND | 2.% | ND | 0.7 | ND | 2 | 0.01 | 0.6 |
| DZR-150 mm from TE | ND | 7.% | ND | 1.0 | 0.06 | 0.2 | 0.02 | 0.03 |
| DZR-300 mm from TE | ND | 2.% | ND | 0.1 | ND | ND | 0.01 | 0.01 |
| QZR-75 mm from TE | ND | 3.% | 0.02 | 0.1 | ND | 0.06 | 0.3 | 0.02 |
| QZR-150 mm from TE | ND | 2.% | 0.01 | ND | 0.06 | ND | 0.02 | 0.02 |

All values were obtained by SSMS analyses except those for Ga of Te with added CdTe. The latter values were obtained by emission spectroscopy (ES) because of possible interference of the Ga mass peak at high concentrations of Cd. The ES analyses of the zone refined Te without added CdTe show no trace of Ga. The data show enhanced purification for Ga, Ca and K as compared to Te which was zone refined without the addition of CdTe as gettering substance.

The level of Cd in the centre portion of the QZR Te ingot was found to be 5 ppmw. The high levels of Cd in the tail end samples demonstrated the strong segregating behaviour of Cd in Te.

The enhanced segregation of both Ca and K is quite obvious. Both show slight tail end moving behaviour which was enhanced by the presence of Cd in the Te melt.

EXAMPLE 3

To further test the quality of the Cd and Te purified by zone refining with CdTe addition, a number of $Cd_{0.21}Hg_{0.79}Te$ single crystals were prepared using these elements as precursors. Synthesis of the CdHgTe was done by loading stiochiometric weights of QZR Cd and Te, and a 7/9 grade Hg into a clean quartz ampoule which was sealed under vacuum. The ampoule was heated above the liquidus temperature for the x=0.21 alloy and then quenched in a thermal gradient to obtain a homogeneous alloy composition suitable for a recrystallization process for single crystal growth. Slices were cut from the single crystals and the slices were annealed in an overpressure of Hg to convert the asgrown slices from p to n-type conductivity. The electrical parameters of carrier concentration and mobility, measured at 77K using the Van der Pauw technique, were used to characterize the purity of the CdHgTe slices.

For comparison the carrier concentration and mobility were determined for a similar number of slices cut from normal production crystals, i.e. crystals produced with Cd and Te zone refined without the addition of gettering substance.

The average values for the carrier concentration and the mobility at 77K for the highest purity 50 percentile fraction of production slices of $Cd \times Hg_{1-x}Te$ (x=0.21) were $$2.00 \times 10^{14} \, cm^{-3}$$

and $$2.01 \times 10^5 \, cm^2 V^{-1} s^{-1},$$

respectively.

The yield of the slices of CdHgTe, with characteristics equal to or better than these values, was 70% higher for slices made with Cd and Te produced according to the invention than slices of CdHgTe made with Cd and Te zone refined without the addition of gettering substance.

What we claim as new and desire to protect by Letters Patent of the United States is:

1. A method for the purification of a metal chosen from the group consisting of cadmium and tellurium which comprises adding to an ingot of the metal an amount of a gettering substance chosen from the group consisting of tellurium, cadmium and cadmium telluride, subjecting the metal with added gettering substance to multiple-pass zone refining, said amount of tellurium or the amount of tellurium in cadmium telluride added in the zone refining of cadmium being less than the amount of tellurium in the cadmium rich eutectic composition between cadmium and tellurium, and said amount of cadmium or the amount of cadmium in cadmium-telluride added in the zone refining of tellurium being less than the amount of cadmium in the tellurium-rich eutectic composition between cadmium and tellurium, and cropping said ingot after multiple zone refining to recover a product of reduced impurity content.

2. A method as claimed in claim 1 wherein, the metal to be purified is cadmium, the gettering substance is tellurium, and the tellurium is added at the leading end of the ingot of cadmium prior to zone refining in an amount less than about 10 parts per million by weight of said ingot of cadmium.

3. A method as claimed in claim 1 wherein the metal to be purified is cadmium, the gettering substance is cadmium telluride, the cadmium telluride is added at the leading end of the ingot of cadmium prior to zone refining, and the amount of tellurium in the added cadmium telluride is in an amount less than about 10 parts per million by weight of said ingot of cadmium.

4. A method as claimed in claim 1 wherein the metal to be purified is tellurium, the gettering substance is cadmium, and the cadmium is added at the leading end of the ingot of tellurium prior to zone refining in an amount less than about 1% by weight of said ingot of tellurium.

5. A method as claimed in claim 1 wherein the metal to be purified is tellurium, the gettering substance is cadmium telluride, the cadmium telluride is added at the leading end of the ingot of tellurium prior to zone refining, and the amount of cadmium in the cadmium in the added cadmium telluride is in an amount less than about 1% by weight of said ingot of tellurium.

* * * * *